(12) United States Patent
Aoki

(10) Patent No.: US 6,788,278 B2
(45) Date of Patent: Sep. 7, 2004

(54) ELECTRO-OPTICAL DEVICE AND ELECTRONIC APPARATUS

(75) Inventor: Koji Aoki, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/453,576

(22) Filed: Jun. 4, 2003

(65) Prior Publication Data

US 2004/0012058 A1 Jan. 22, 2004

(30) Foreign Application Priority Data

Jun. 7, 2002 (JP) .......................................... 2002-167773
Jun. 7, 2002 (JP) .......................................... 2002-167774
Jun. 2, 2003 (JP) .......................................... 2003-157388

(51) Int. Cl.[7] .............................. G09G 3/32; G02F 1/07
(52) U.S. Cl. .............................. 345/82; 345/76; 345/60; 359/245; 359/254
(58) Field of Search ................................. 359/321, 245, 359/252, 254; 345/36, 84, 215, 60, 76–82, 206; 257/80, 81, 99, 506

(56) References Cited

U.S. PATENT DOCUMENTS

2002/0011976 A1 * 1/2002 Hashimoto ................... 345/76

FOREIGN PATENT DOCUMENTS

JP      A-5-3080      1/1993

* cited by examiner

*Primary Examiner*—Georgia Epps
*Assistant Examiner*—M. Hasan
(74) *Attorney, Agent, or Firm*—Oliff & Berridge, PLC

(57) ABSTRACT

The invention provides an electro-optical apparatus which is capable of narrowing the frame region. At least a part of at least one power source line among a plurality of power source lines is formed of a conductive layer provided at a first wiring line layer and a conductive layer provided at a second wiring line layer, thereby capable of narrowing a width of the power source line.

14 Claims, 13 Drawing Sheets

[Fig. 1]
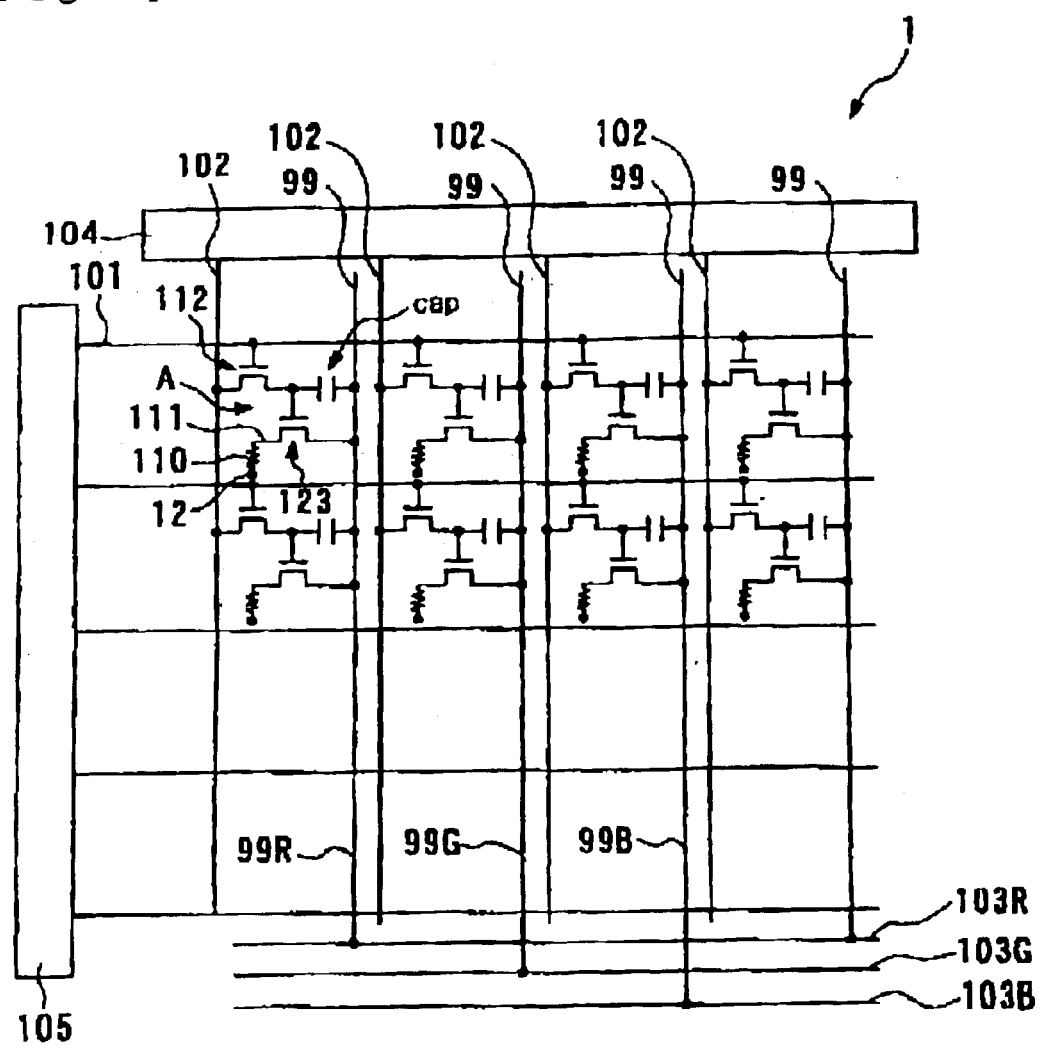

[Fig. 2]
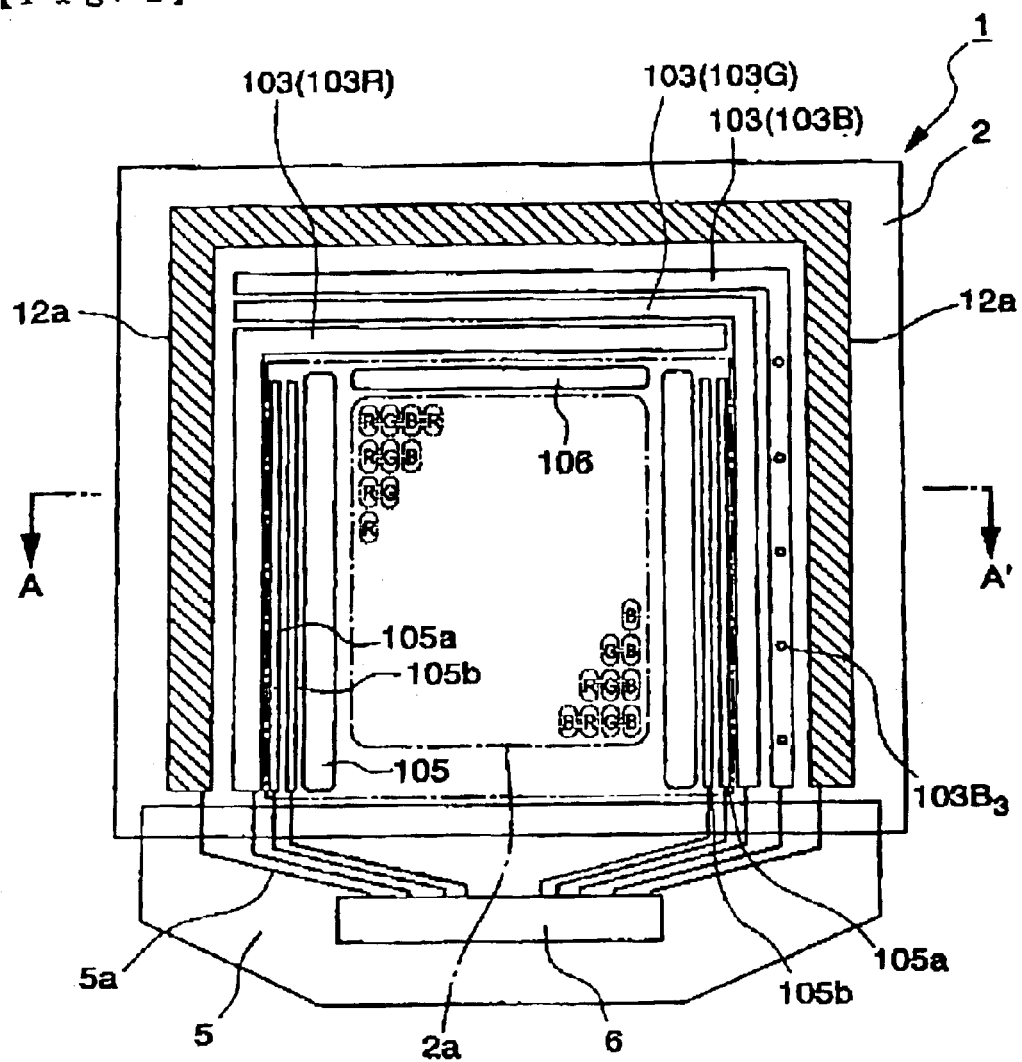

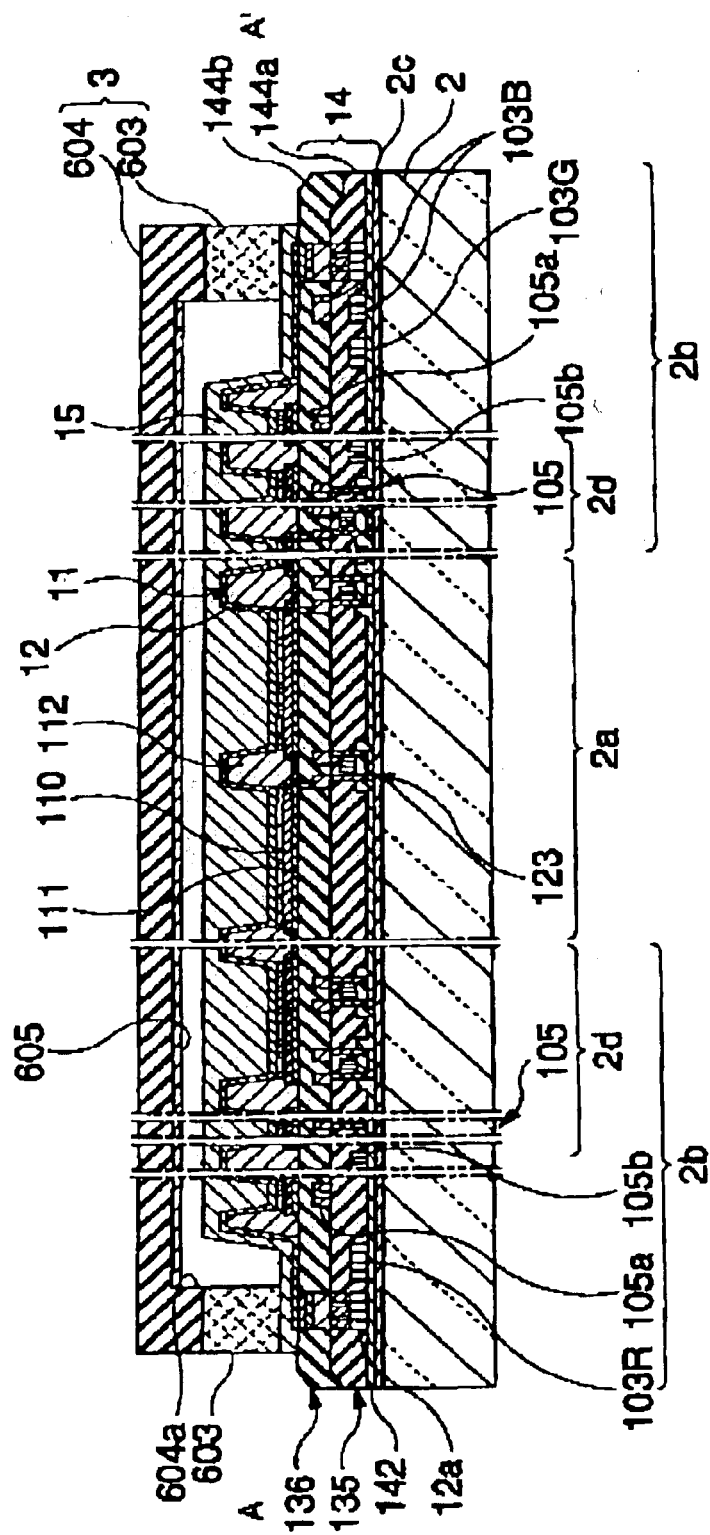
[Fig. 3]

[Fig. 4]
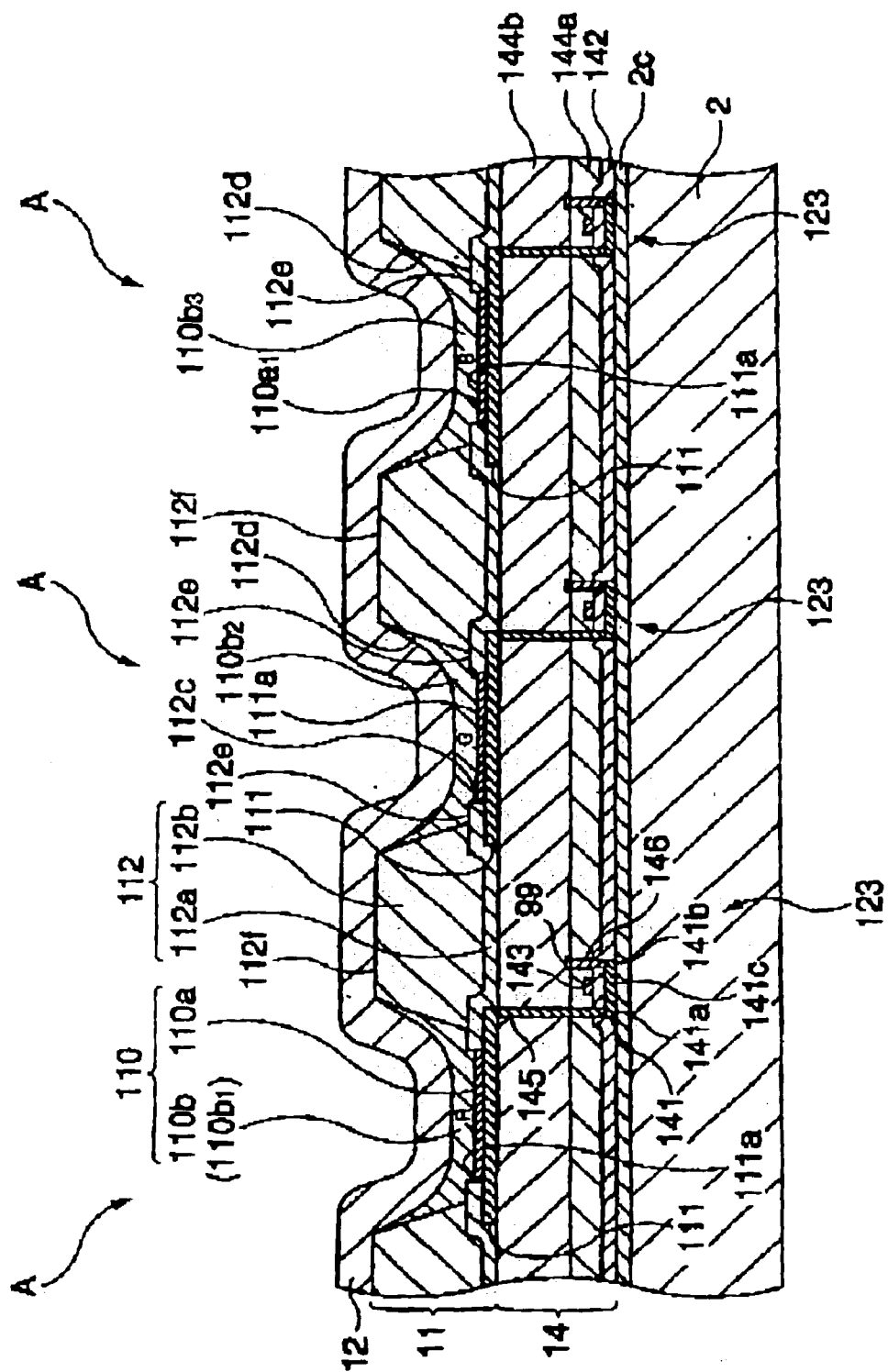

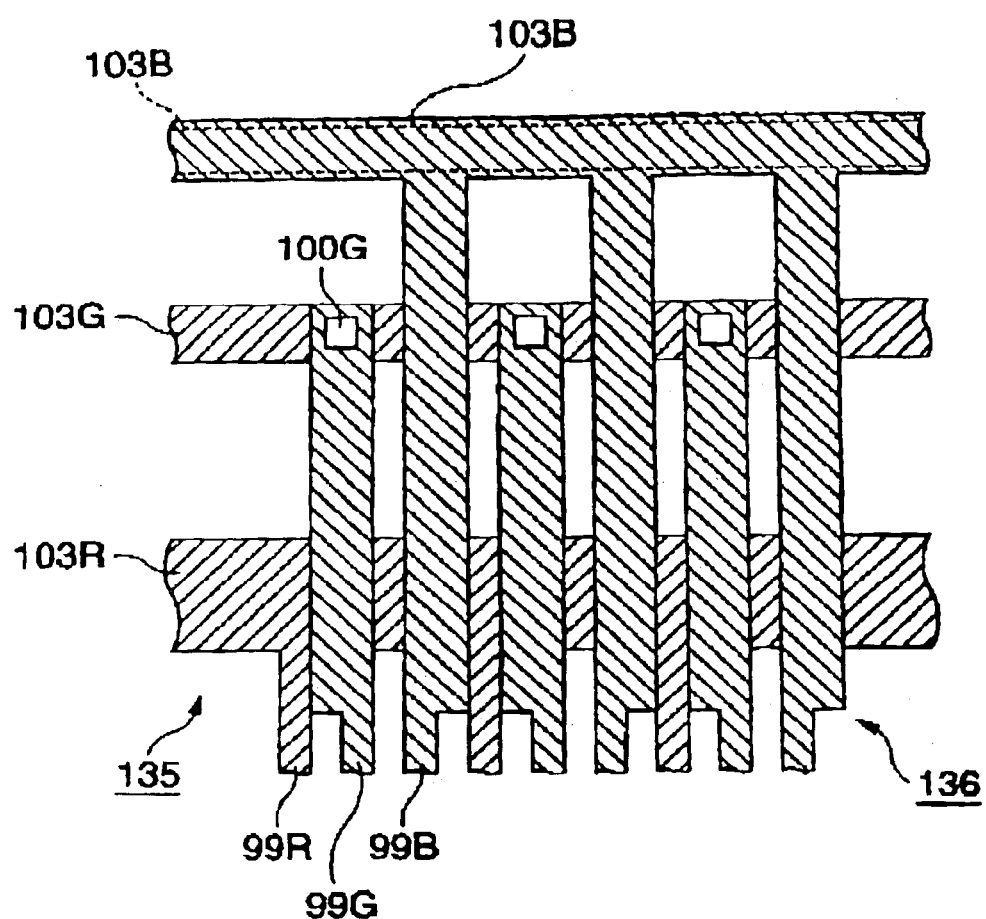
[Fig. 5]

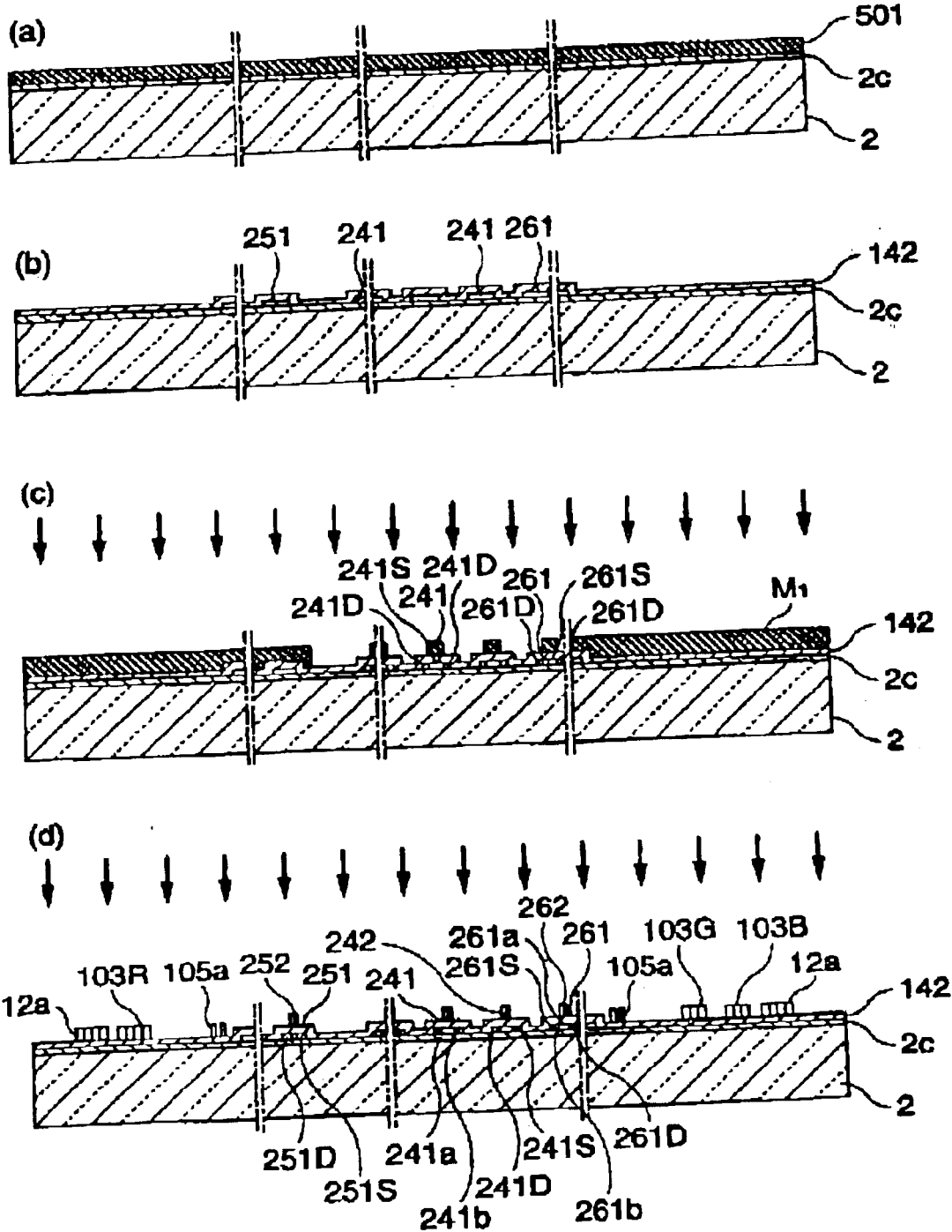
[Fig. 6]

[Fig. 7]
(a)
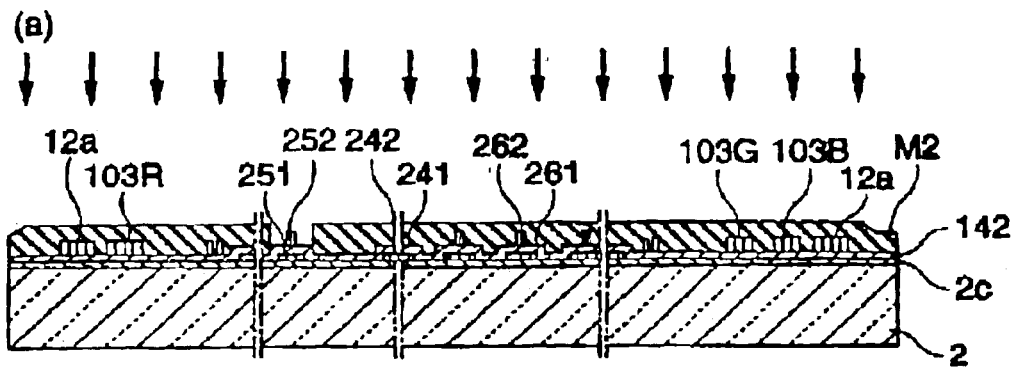
(b)
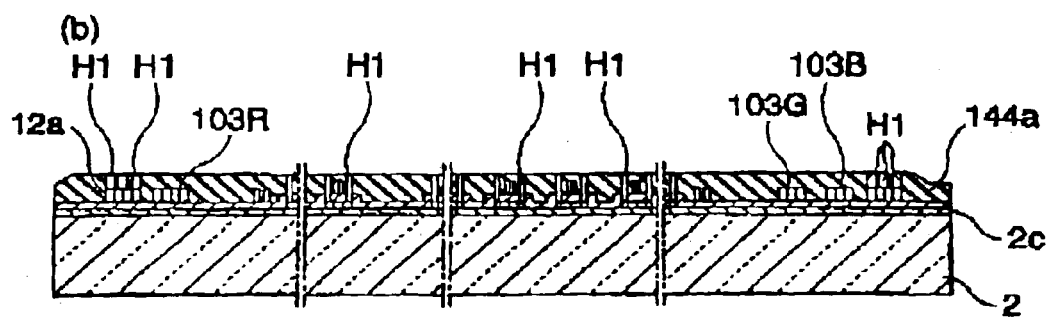
(c)
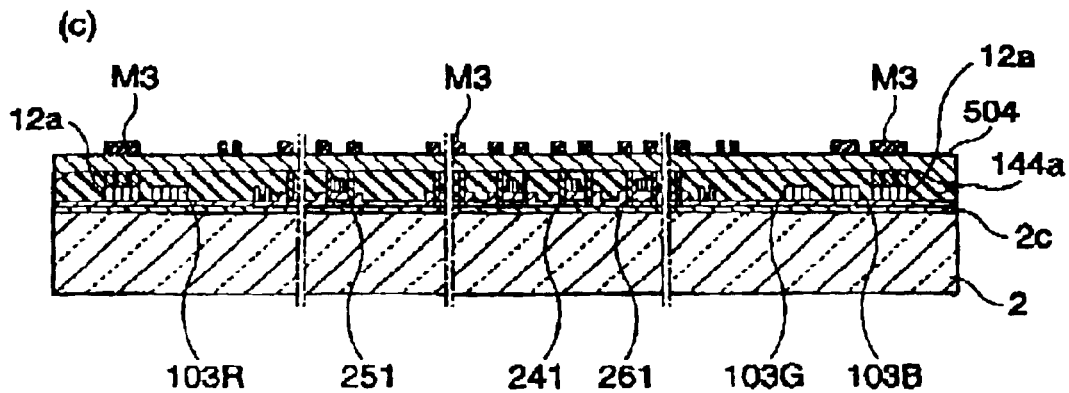

[Fig. 8]
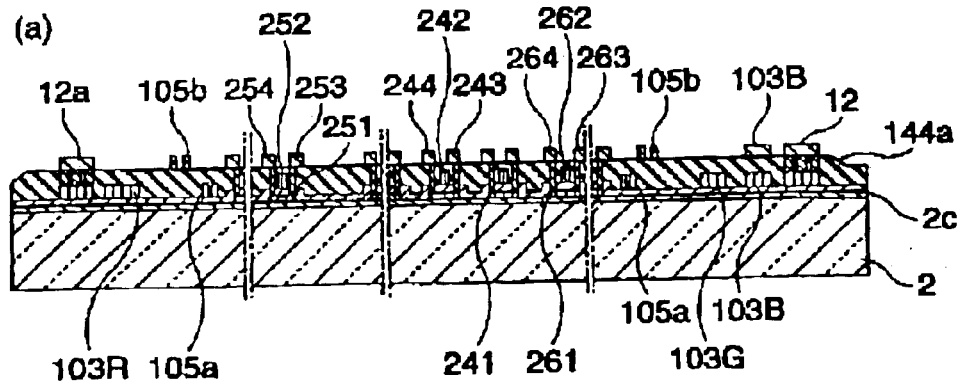
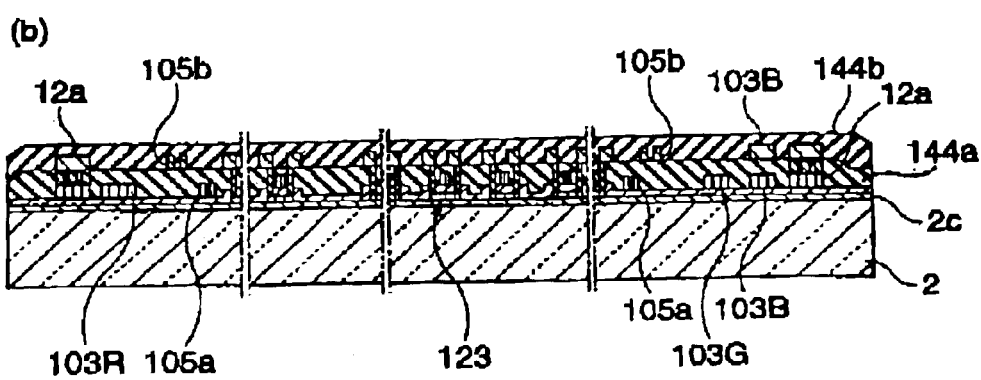
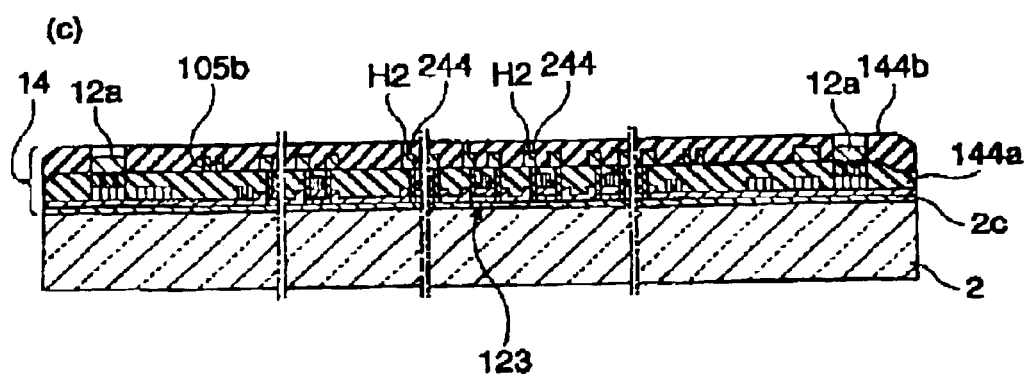

[Fig. 9]
(a)
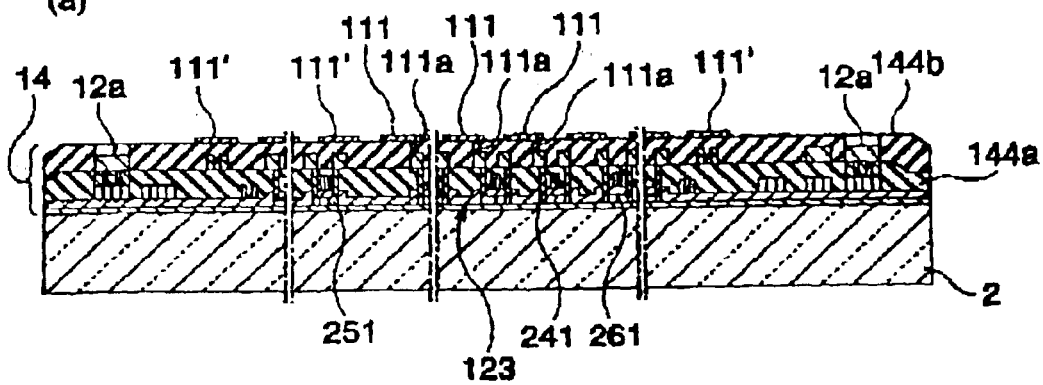
(b)
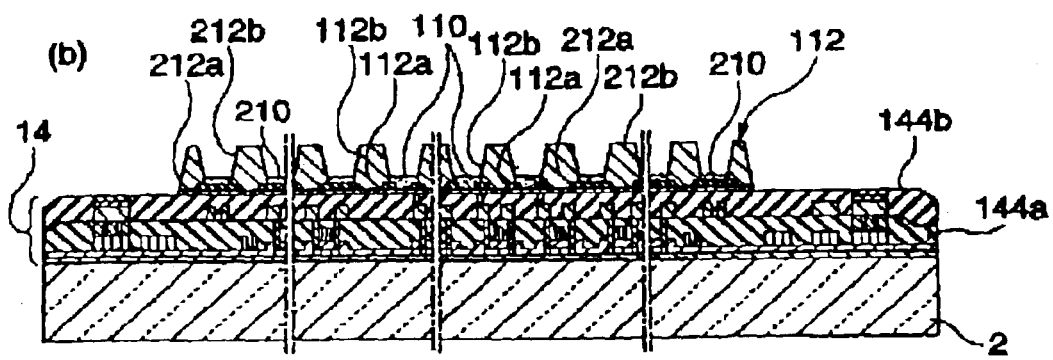
(c)
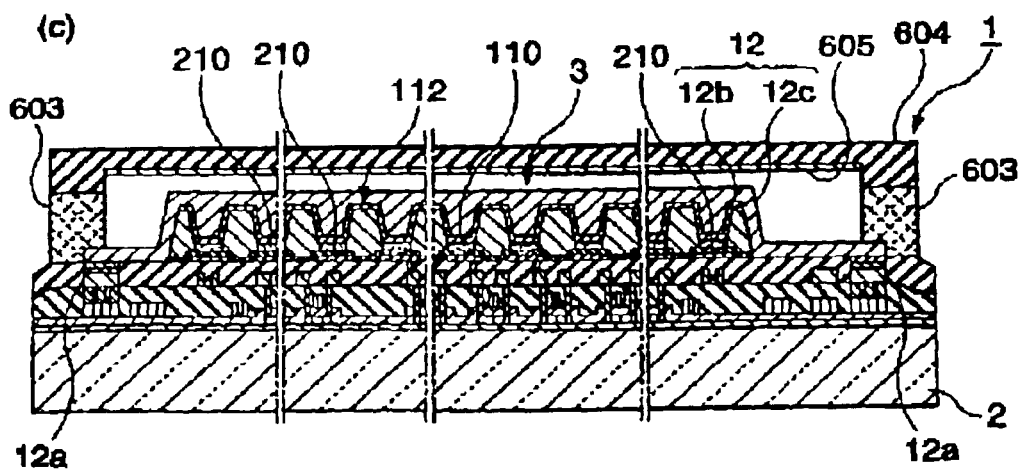

[Fig. 10]
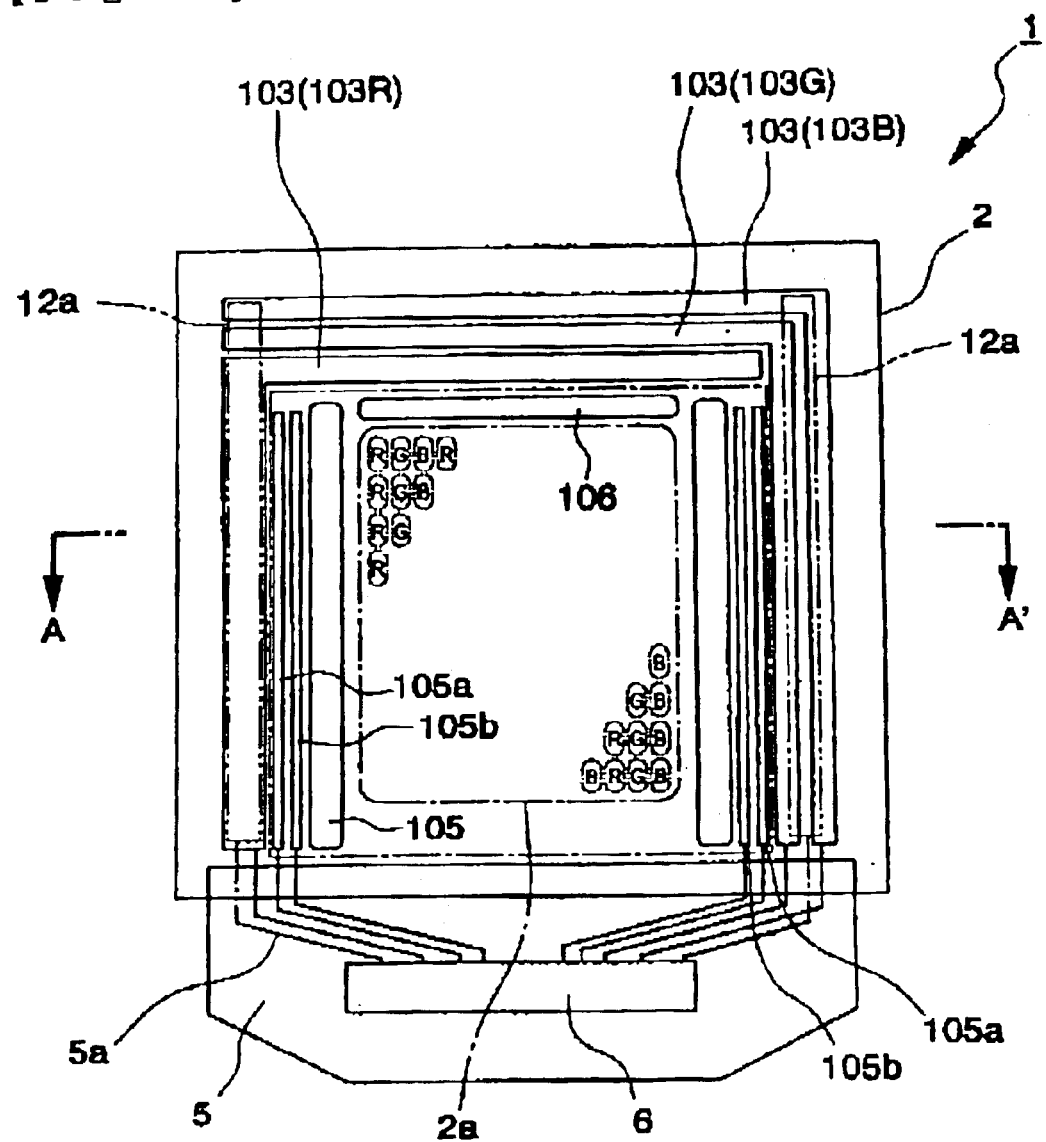

[Fig. 11]
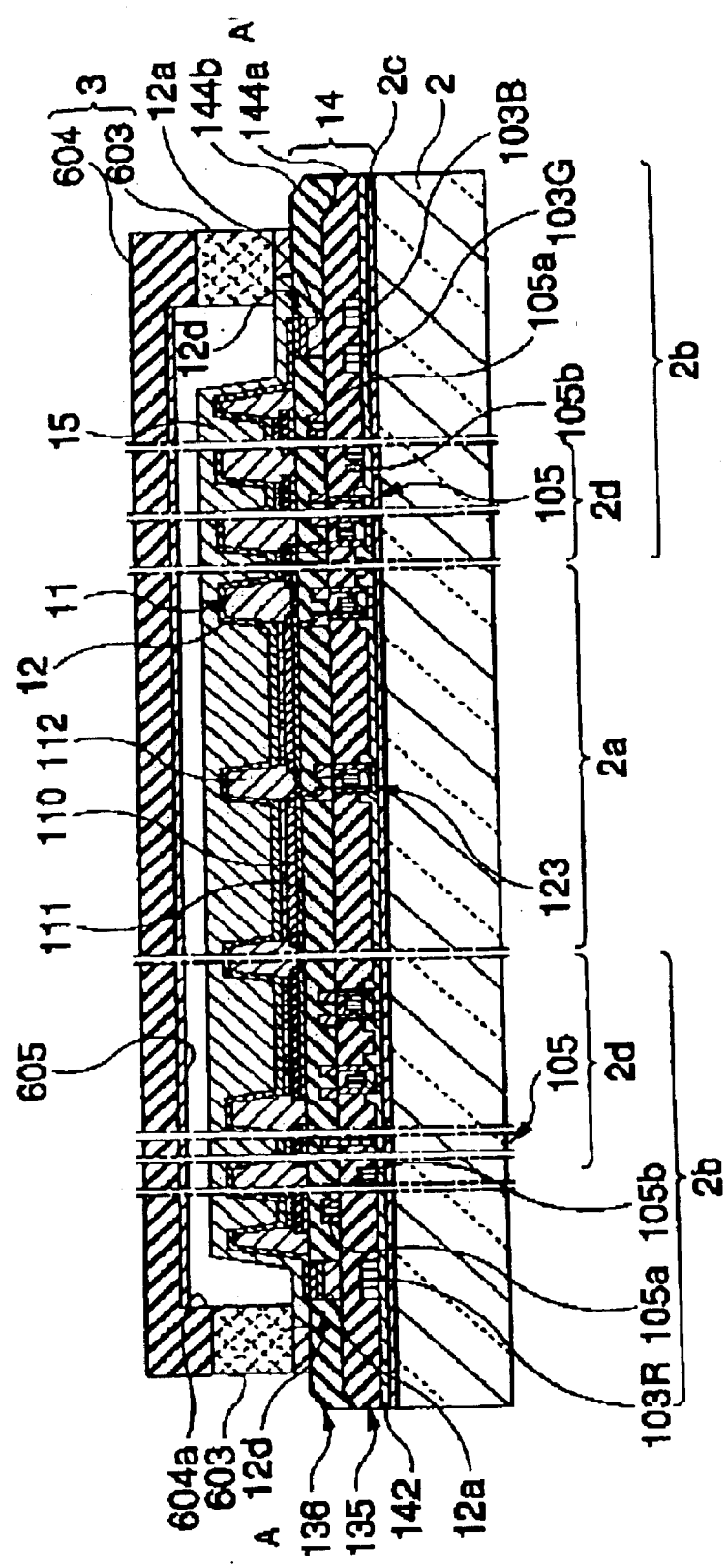

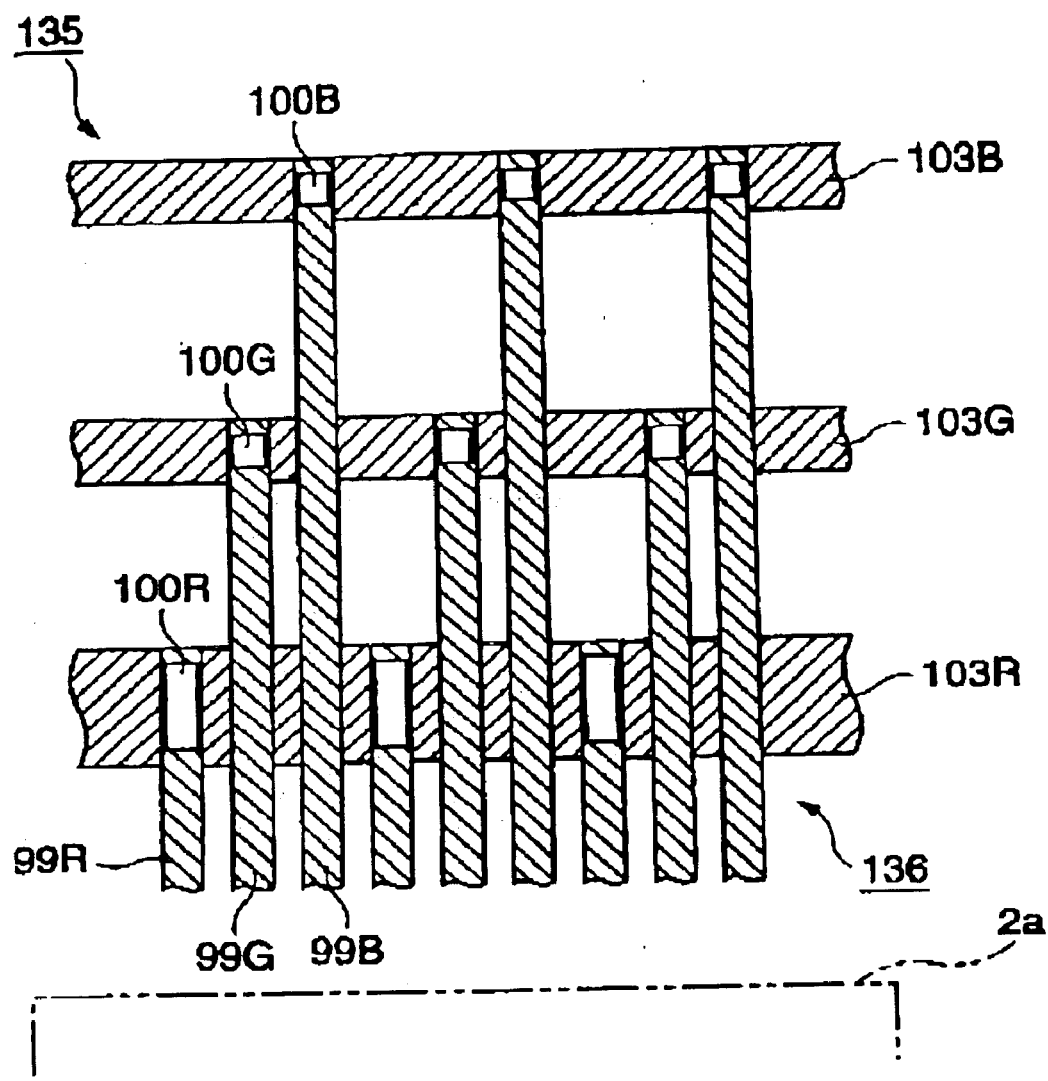
[Fig. 12]

[Fig. 13]
(a)
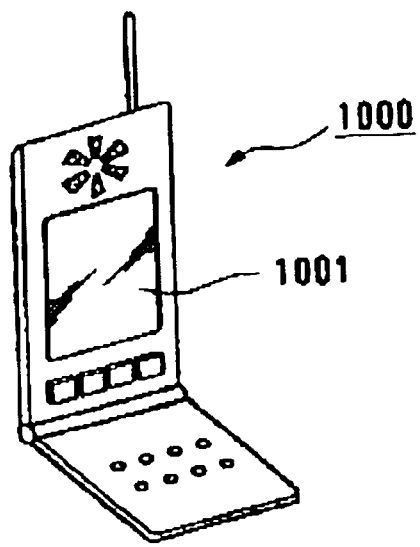
(b)
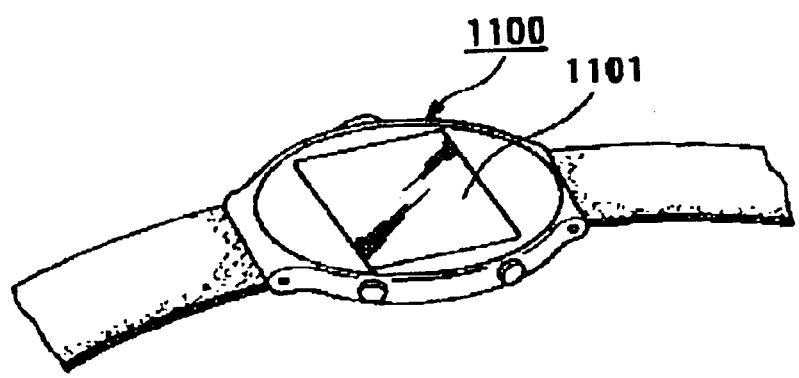
(c)
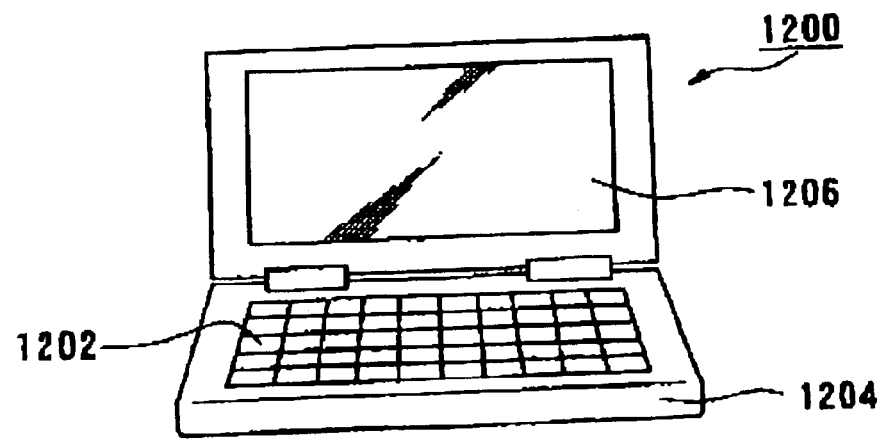

ELECTRO-OPTICAL DEVICE AND ELECTRONIC APPARATUS

BACKGROUND OF THE INVENTION

1. Field of Invention

The present invention relates to an electro-optical device and an electronic apparatus.

2. Description of Related Art

The related art includes an organic electro-luminescent (EL) display device with a light-emitting element using an organic light-emitting material between a substrate where a pixel electrode is formed and a common electrode (for example, see Gazette of Japanese Unexamined Patent Application Publication No. 5-3080).

According to an organic EL display device, a light-emitting element emits light by supplying current thereto. At this time, the brightness of the light-emitting element is determined basically by the amount of supplied current.

SUMMARY OF THE INVENTION

It is necessary to accurately set the amount of current to a desired value because the brightness of a light-emitting element is basically determined by the amount of supplied current.

When sufficient amount of electric current is secured, the width of wiring lines for supplying current increases. Accordingly, a frame region increases and it is difficult to mount the light-emitting devices on various electronic apparatuses.

The present invention addresses the above and/or other circumstances, and secures a sufficient amount of current or reduces or suppresses a change in the brightness of the light-emitting element due to a change in a power source voltage. The present invention also provides a light-emitting device and an electronic apparatus, which are capable of satisfying the above-mentioned requirements and of narrowing the frame region.

In order to address or achieve the above, the present invention adopts the following exemplary structure.

A first electro-optical device according to the present invention is provided, including: a plurality of light-emitting power source wiring lines arranged in a first layer of a substrate, and a plurality of connection wiring lines to connect the light-emitting power source wiring lines to corresponding electrodes arranged in a second layer electrically insulated from the first layer. The outermost light-emitting power source wiring line among the plurality of light-emitting power source wiring lines is provided in both the first and second layers.

The outermost light emitting power source wiring line may be provided on a second layer because it does not overlap the connection wiring lines in plane. Therefore, according to the present invention, when the light-emitting power source wiring lines provided on the first and second layers are electrically connected to the corresponding electrodes, it is possible to reduce the width of the light-emitting power source wiring line on each layer compared to a width in a case where the light-emitting power source wiring lines are provided only on the first layer. Therefore, according to the present invention, it is possible to reduce the size of the frame of a panel as much as the reduced width of the light-emitting power source wiring line.

According to the above electro-optical device, the connection wiring lines connected to the innermost light-emitting power source wiring line among the plurality of light-emitting power source wiring lines is preferably provided in the first layer.

The connection wiring lines connected to the innermost light-emitting power source wiring line may be provided in the first layer because it does not overlap other light-emitting power source wiring lines other than the innermost light-emitting power source wiring line. Therefore, according to the present invention, it is possible to increase the thickness of the other connection wiring lines provided on the second layer by the width of connection wiring lines and to facilitate manufacturing of the connection wiring line. Also, it is possible to reduce dependency on contact resistance because it is not necessary to contact the outermost and the innermost light-emitting power source wiring lines to the connection wiring lines.

It is possible to adopt a structure where a hole injection/transport layer and a light-emitting layer formed of an organic electro-luminescent (EL) material to be adjacent to the hole injection/transport are provided on an electrode.

Therefore, according to the present invention, it is possible to obtain a small panel with low dependency on contact resistance, which emits light by applying driving current to the electrode through the light-emitting power source wiring lines and the connection wiring lines.

A second electro-optical device according to the present invention is provided, including: a light-emitting power source wiring lines and a second electrode wiring lines disposed around a first electrode region where a first electrode is arranged in a matrix on a substrate, the light-emitting power source wiring lines being connected to the first electrode, the second electrode wiring lines being connected to a second electrode having a functional layer interposed between the first electrode and the second electrode. The light-emitting power source wiring line and the second electrode wiring lines are arranged such that at least some of the light-emitting power source wiring line and the second electrode wiring lines overlap each other in plan view.

According to the above electro-optical device, interlayer insulating films are preferably arranged between the light-emitting power source wiring lines and the second electrode wiring line. Therefore, according to the above electro-optical device, it is possible to reduce the region occupied by the light-emitting power source wiring line and the second electrode wiring lines and to narrow the frame of a panel as much as the amount where the light-emitting power source wiring line and the second electrode wiring lines overlap each other in plan view. At least some of the light-emitting power source wiring line and the second electrode wiring lines overlap each other to form capacitance and it is possible to stably display a picture by reducing a change in electric potential of driving current.

According to the above electro-optical device, interlayer insulating films are preferably arranged between the light-emitting power source wiring line and the second electrode wiring line. Accordingly, it is possible to insulate the light-emitting power source wiring line from the second electrode wiring lines.

According to the above electro-optical device, it is possible to adopt a structure where either the light-emitting power source wiring line or the second electrode wiring lines is arranged in the region occupied by the other one.

According to the present invention, it is not necessary to additionally prepare a region where either the light-emitting power source wiring line or the second electrode wiring lines is arranged in plan view. Accordingly, it is possible to narrow the frame.

It is possible to adopt a structure where a hole injection/transport layer and a light-emitting layer formed of an organic electro-luminescent (EL) material to be adjacent to the corresponding hole injection/transport layer are provided as a functional layer.

According to the present invention, it is possible to obtain a small panel that emits light by applying the driving current to the first electrode through the light-emitting power source wiring lines.

A third electro-optical device according to the present invention provided, including: a plurality of pixels, which is provided in an effective area on a substrate, having an electro-optical element including a functional layer interposed between a first electrode and a second electrode; electrode wiring lines connected to the second electrodes outside the effective area; connection wiring lines connected to the first electrodes through active elements and provided at least in the effective area; and power source lines connected to the connection wiring lines outside the effective area, wherein at least some of the power source lines is formed of a plurality of conductive films separated by interlayer insulating films and conductive materials electrically connecting the plurality of conductive films to each other.

A fourth electro-optical device is provided, including: a plurality of pixels, which are provided in an effective area on a substrate, having an electro-optical element including a functional layer interposed between a first electrode and a second electrode; electrode wiring lines connected to the second electrodes outside the effective area; connection wiring lines connected to the first electrodes through active elements and provided at least in the effective area; and power source lines connected to the connection wiring lines outside the effective area, wherein the plurality of power source lines are provided outside the effective area, and wherein, among the power source lines, at least some of the power source lines provided to be remotest from the effective area is formed of a plurality of conductive films separated by interlayer insulating films and conductive materials electrically connecting the plurality of conductive films to each other.

It is possible to reduce the width of each layer by increasing the layer number of power source lines as similarly in the above-mentioned electro-optical device compared to a case where the power source lines includes only one wiring line layer. Accordingly, it is possible to secure enough amount of current and to narrow the frame.

A fifth electro-optical device according to the present invention is provided, including: a plurality of pixels, which are provided in an effective area on a substrate, having an electro-optical element including a functional layer interposed between a first electrode and a second electrode; electrode wiring lines connected to the second electrodes outside the effective area; connection wiring lines connected to the first electrodes through active elements and provided at least in the effective area; and power source lines connected to the connection wiring lines outside the effective area. Among the power source lines, the power source line provided to be the closest to the effective area is formed of conductive film provided only in one wiring line layer.

A sixth electro-optical device according to the present invention is provided, including: a plurality of pixels, which are provided in an effective area on a substrate, having an electro-optical element including a functional layer interposed between a first electrode and a second electrode; electrode wiring lines connected to the second electrodes outside the effective area; connection wiring lines connected to the first electrodes through active elements and provided at least in the effective area; and power source lines connected to the connection wiring lines outside the effective area, wherein the width of the connection wiring lines is different from the width of the power source line, to which a corresponding connection wiring lines is connected.

It is necessary to narrow the width of the connection wiring lines to be suitable for a pixel pitch in the effective area. Meanwhile, it is necessary secure enough amount of current supplied to a pixel through the connection wiring lines. Therefore, according to the electro-optical device, it is possible to correspond to the pixel pitch and to secure the amount of current by making the width of the power source lines larger than the width of the connection wiring line.

A seventh electro-optical device is provided, including: a plurality of pixels, which are provided in an effective area on a substrate, having an electro-optical element including a functional layer interposed between a first electrode and a second electrode; electrode wiring lines connected to the second electrodes outside the effective area; connection wiring lines connected to the first electrodes through active elements and provided at least in the effective area; and power source lines connected to the connection wiring lines outside the effective area, wherein the width of a first portion of the connection wiring lines is different from the width of a second portion of the connection wiring line.

In the above electro-optical device, the first portion is, for example, near contact portions where the connection wiring lines are connected to the power source lines in the connection wiring lines. The second portion is, for example, either closer to the effective area than the first portion or in the effective area. In this case, the width of the first portion is preferably larger than the width of the second portion.

It is possible to relieve a change in or unstableness of the amount of supplied current due to the falling of a voltage or the increase in resistance, which is caused by a difference in the width or the material of the contact portion by providing a portion where line width of the line is different from each other in the same wiring line such as the connection wiring line.

An eighth electro-optical device according to the present is provided, including: a plurality of pixels, which is provided in an effective area on a substrate, having an electro-optical element including a functional layer interposed between a first electrode and a second electrode; electrode wiring lines connected to the second electrodes outside the effective area; connection wiring lines connected to the first electrodes through active elements and provided at least in the effective area; and power source lines connected to the connection wiring lines outside the effective area. At least one of the plurality of connection wiring lines is formed of a plurality of conductive films, each of which is provided in each of the plurality of wiring line layers, and conductive materials connecting the conductive films to each other.

In the effective area, it is preferable that all the connection wiring lines are basically provided on the same layer. It is disadvantageous to effectively using a restricted space to locate all the connection wiring lines on the same layer at least near contact portions where the connection wiring lines contact the power source lines because it is common that a plurality of contact portions exist near the contact portion where the connection wiring lines contact the power source lines. It is possible to satisfy the above-mentioned two requirements by forming at least one among the connection wiring lines using another wiring layer like in the electro-optical device.

A ninth electro-optical device according to the present invention is provided, including: a plurality of pixels, which is provided in an effective area on a substrate, having an electro-optical element including a functional layer interposed between a first electrode and a second electrode; electrode wiring lines connected to the second electrodes outside the effective area; connection wiring lines connected to the first electrodes through active elements and provided at least in the effective area; and power source lines connected to the connection wiring lines outside the effective area, wherein second conductive films forming at least some of the power source lines are formed between first conductive films forming at least some of the electrode wiring lines and the substrate. The first and second conductive films are separated by interlayer insulating films. At least some of the first conductive films overlap at least some of the second conductive films.

According to the above electro-optical device, it is possible to reduce a frame region by stacking the power source lines and the electrode wiring lines through the interlayer insulating film. Furthermore, it is possible to relax the change in a voltage because it is possible to form capacity between the power source lines and the electrode wiring lines.

In the electro-optical device, the second conductive films are preferably connected to the connection wiring lines through the contact portion provided in the interlayer insulating films.

In the electro-optical device, the functional layer may be formed of the organic EL material.

An electronic apparatus according to the present invention comprises the above-mentioned electro-optical device.

BRIEF DESCRIPTION OF THE DRAWINGS

FIG. 1 is a schematic plan view of the structure of wiring lines of a display device according to an exemplary embodiment of the present invention.

FIG. 2 is a schematic plan view of a display device according to a first exemplary embodiment of the present embodiment.

FIG. 3 is a cross-sectional view taken along the line A-A' in FIG. 2;

FIG. 4 is a schematic that shows an enlarged section of a sectional view of FIG. 3;

FIG. 5 is an schematic extended view of power source lines and a connection line connected to each power source lines according to a first exemplary embodiment of the present invention;

FIG. 6(a) to FIG. 6(d) are schematics explaining a display device according to an exemplary embodiment of the present invention;

FIG. 7(a) to FIG. 7(c) are schematics explaining a display device according to an exemplary embodiment of the present invention;

FIG. 8(a) to FIG. 8(c) are schematics explaining a display device according to an exemplary embodiment of the present invention;

FIG. 9(a) to FIG. 9(c) are schematics explaining a display device according to an exemplary embodiment of the present invention;

FIG. 10 is a schematic plan view of a display device according to a second exemplary embodiment of the present invention;

FIG. 11 is a cross-sectional view taken along the line A-A' of FIG. 10;

FIG. 12 is a schematic extended view of power source lines and a connection line connected to each power source lines according to a second exemplary embodiment of the present invention;

FIGS. 13(a)–13(c) are schematics illustrating an exemplary embodiment of an electronic apparatus having an organic EL display device, where FIG. 13(a) is a perspective view of a cellular phone, FIG. 13(b) is a perspective view of a wristwatch type electronic apparatus, and FIG. 13(c) is a perspective view of a portable information processing apparatus.

DETAILED DESCRIPTION OF PREFERRED EMBODIMENTS

First Exemplary Embodiment

A first exemplary embodiment of an electro-optical device and an electronic apparatus according to the present invention will be described with reference to FIG. 1 to FIG. 10. In the respective drawings shown hereinafter, a scale of each layer or member varies in order to have recognizable size in the drawings.

FIG. 1 is a schematic plan view of the structure of wiring lines of an electro-optical device according to the present invention.

As shown in FIG. 1, in a display device (an electro-optical device) 1 according to the present embodiment, a plurality of scanning lines 101, a plurality of data lines 102 extending in a direction intersecting the scanning lines 101 and a plurality of connection wiring lines 99 extending parallel to the data lines 102 are wired. Pixel regions A are provided at each of intersecting portions of the scanning lines 101 and the data lines 102.

A data driving circuit 104 including a shift register, a level shifter, a video line and an analog switch is connected to the data lines 102. A scanning line driving circuit 105 including a shift register and a level shifter is connected to the scanning lines 101. Furthermore, each pixel area A includes a switching thin film transistor 112 where a scanning signal is supplied to a gate electrode through the scanning lines 101, a storage capacitor cap to store a pixel signal supplied from the data lines 102 through the switching thin film transistor 112, a driving thin film transistor 123 where a pixel signal stored by the corresponding storage capacitor cap is supplied to the gate electrode as a voltage, a pixel electrode (anode) 111, to which driving current flows from corresponding power source lines 103 when the pixel electrode 111 is electrically connected to the power source lines (light-emitting power source wiring lines) 103 through the driving thin film transistor 123 and the connection wiring lines 99 (99R, 99G and 99B), and a functional layer 110 interposed between the pixel electrode 111 and a common electrode (a cathode) 12. A light-emitting element includes the pixel electrode 111, the common electrode 12 and the functional layer 110.

According to the above-structure, when the switching thin film transistor 112 is turned on by driving the scanning lines 101, the electric potential of the data lines 102 at that time is stored in the storage capacitor cap. The conduction state of the driving thin film transistor 123 is determined in accordance with state of the storage capacitor cap. Current flows to the pixel electrode 111 from the power source lines 103, the connection wiring lines 99, and the thin film transistor 123 through a channel of the driving thin film transistor 103. Furthermore, current flows to the common electrode 12 through a functional layer 110. The functional layer 110 emits light to be suitable for the amount of current flowing thereto.

FIG. 2 is a schematic plan view of an electro-optical device according to the present embodiment.

A substrate 2 is a transparent substrate such as glass. The substrate 2 is divided into a display area (an electrode area) 2a provided in the center of the substrate 2 and an ineffective area 2b provided at the edge of the substrate 2 and arranged outside the effective area 2a. The effective area 2a includes pixels R, G and B having light-emitting elements arranged in a matrix. The effective area 2a is a display area actually contributing to display. The pixels R, G and B correspond to red, green and blue pixels, respectively.

A common electrode wiring lines 12a connected to the common electrode 12 is u-shaped such that the common electrode wiring lines 12a surrounds three sides among four sides forming the outer periphery of the effective area 2a.

The power source lines 103 are provided between the effective area 2a and the common electrode wiring lines 12a. The power source lines 103R, 103G and 103B supply a power source voltage to the pixels R, G and B through the connection wiring lines 99R, 99G and 99B shown in FIG. 1, respectively.

The power source lines 103B remotest from the effective area 2a among the power source lines 103R, 103G and 103B has a double wiring structure. Contact holes $103B_3$ are provided to perform conduction up and down.

A test circuit 106 is provided between the effective area 2a and the power source lines 103R remotest to the effective area 2a among the power source lines 103. The test circuit 106 is used for examining the quality and the defects of display devices during a manufacturing process or forwarding of products.

A flexible substrate 5 with a driving integrated circuit (IC) 6 is mounted at a side of the substrate 2 oppose to the test circuit 106 with respect to the effective area 2a. The common electrode wiring lines 12a and the power source lines 103 are connected to the driving IC 6 through wiring lines 5a.

A scanning line driving circuit 105 is provided in each of a region between the effective area 2a and the power source lines 103R and a region between the effective area 2a and the power source lines 103G from a side of the substrate 2 at which the flexible substrate 5 is mounted in a direction facing the side of the substance. A control driving circuit control signal wiring line 105a and a driving circuit power source wiring line 105b to supply control signal and power source voltage to the scanning line driving circuit 105 are provided in an area between the scanning line driving circuit 105 and the power source lines 103R and a region between the scanning line driving circuit 105 and the power source lines 103G.

FIG. 3 is a schematic view taken along the line A-A' in FIG. 2. As shown in FIG. 3, an active element layer 14 is included between a light-emitting element portion 11 including a light-emitting element and a bank portion provided to correspond to the effective area 2a and the substrate 2. The active element layer 14 include the scanning lines, the data lines, the storage capacitor, the switching thin film transistor 112 and the driving thin film transistor 123.

The aforementioned power source lines 103 (103R, 103G and 103B) are wired corresponding to the ineffective area 2b of the active element layer 14. A part of the ineffective area 2b is used as a dummy region 2d. The dummy region 2d is used to stabilize the discharge amount of a material forming the light-emitting element before forming the light-emitting element 110 by mainly using an inkjet process. That is, the dummy region 2d is a region for performing a test.

The aforementioned scanning line driving circuit 105, the driving circuit control signal wiring line 105a and the driving circuit power source wiring line 105b are provided in the active element layer 14 below the dummy region 2d. Although not shown in FIG. 3, the dummy region 2d may be provided above the test circuit 106.

The power source line 103R is formed using conductive films provided on a first wiring line layer 135. The power source line 103G is also formed using the conductive film provided in the first wiring line layer 135. On the contrary, the power source lines 103B have a double wiring structure as mentioned above. Concretely, the power source line 103B is formed of the conductive film provided in the first wiring line layer 135 and the conductive film provided in the second wiring line layer 136. A first interlayer insulating film 144a is provided between the above two conductive films. The two conductive films are electrically connected to each other through contact holes (corresponding to the contact holes $103B_3$ shown in FIG. 2) provided in the first interlayer insulating film 144a.

The common electrode wiring lines 12a specifically includes the conductive film provided in the first wiring line layer 135 and the conductive film provided in the second wiring line layer 136.

The light-emitting element portion 11 is covered with a sealing portion 3. The sealing portion 3 includes a sealing resin 603 provided on the active element layer 14 and a sealing substrate 604. The sealing resin 603 is formed of thermosetting resin or ultraviolet (UV) setting resin and, in particular, is formed of epoxy resin, one of the types of thermosetting resins. The sealing resin 603 is arranged along the outer periphery of the substrate and is formed of, for example, a micro-dispenser. The sealing resin 603 connects the active element layer 14 to the sealing substrate 604 so as to thus prevent water or oxygen from entering a space formed by the light-emitting element portion 11 between the active element layer 14 and the sealing substrate 604. Accordingly, the sealing resin 603 prevents the deterioration of a light-emitting layer (not shown) formed in the common electrode 12 or the light-emitting element portion 11.

The sealing substrate 604 is formed of, for example, glass, plastic and a metal. A concave portion 604a for receiving the light-emitting element portion 11 is provided in the sealing substrate 604. A getter 605 for absorbing water or oxygen is arranged in the concave portion 604a so that water and oxygen entering the space formed by the sealing substrate 604 and the light-emitting element portion 11 are absorbed. The getter agent 605 may be omitted.

Aluminum forming the common electrode 12, reflects light emitted by a light-emitting layer 110b to the substrate 2. The common electrode 12 is preferably formed of a silver (Ag) film and a stacked film of aluminum and silver in addition to the aluminum film. The thickness of the common electrode 12 is preferably between 100 and 1,000 nm and, in particular, about 200 nm.

A protective layer 15 for protecting the common electrode 12 formed of SiO, $SiO_2$ and SiN may be provided on the aluminum layer.

The protective layer 15 covers the common electrode 12 and protects a connection portion of the common electrode wiring lines 12a and the common electrode 12. Furthermore, the protective layer 15 is extended to a space below the sealing resin 603 and is interposed between the sealing resin 603 and the active element layer 14.

FIG. 4 shows an enlarged section of a display area in the display device. Three pixel regions A are shown in FIG. 4. The display device 1 is formed such that the active element layer 14 where a circuit such as a thin film transistor (TFT), is formed and the light-emitting element portion 11 where the functional layer 110 is formed are sequentially stacked on the substrate 2.

In the display device 1, light which is emitted from the functional layer 110 to the substrate 2 transmits the active element layer 14 and the substrate 2 and is emitted to a space below the substrate 2 (to an observer). Light emitted from the functional layer 110 to the opposite side of the substrate 2 is reflected by the common electrode 12, transmits the active element layer 14 and the substrate 2 and is emitted to the space below the substrate 2 (to the observer). It is possible to emit light emitted by the common electrode by forming the common electrode 12 with a transparent material. For example, ITO, Pt, Ir, Ni or Pd can be used as the transparent material. The thickness of the common electrode 12 is preferably about 75 nm and is more preferably less than 75 nm.

A base protective layer 2c formed of a silicon oxide film on the substrate 2 is formed in the active element layer 14. An island-shaped semiconductor film 141 is formed of multi-crystal silicon on the base protective film 2c. A drain region 141a and a source region 141b are formed in the semiconductor film 141 by injecting a high-density B ion. A portion in absence of the B ion is a channel region 141c.

A transparent gate insulating film 142 covering the base protective film 2c and the semiconductor film 141 is formed in the active element layer 14. Gate electrodes 143 (the scanning lines 101) are formed of Al, Mo, Ta, Ti or W on the gate insulating film 142. First and second transparent interlayer insulating films 144a and 144b are formed on the gate electrode 143 and the gate insulating film 142, respectively. The gate electrode 143 is provided to correspond to the channel region 141c of the semiconductor film 141.

Contact holes 145 and 146 respectively connected to the drain and source regions 141a and 141b of the semiconductor through the first and second interlayer insulating films 144a and 144b film 141 are formed. The transparent pixel electrode 111 formed of ITO is patterned on the second interlayer insulating film 144b to have a predetermined shape. The drain region 141a is connected to the pixel electrode 111 through the contact hole 145. The source region 141b is connected to the connection wiring lines 99 through the contact hole 146. Accordingly, the driving thin film transistor 123 connected to each pixel electrode 111 is formed in the active element layer 14. The above storage capacitor cap and the switching thin film transistor 112 are formed in the active element layer 14. However, they are not shown in FIG. 4.

As shown in FIG. 4, the light-emitting element portion 11 includes functional layers 110 stacked on the plurality of pixel electrodes 111, bank portions 112 for partitioning the functional layers 110 and the common electrode 12 formed on the functional layers 110. A light-emitting element is formed of the pixel electrodes 111, the functional layers 110 and the common electrode 12. The pixel electrode 111 is formed of, for example, ITO and is patterned to be substantially square in plan view. The thickness of the pixel electrode 111 is preferably between 50 nm and 200 nm and, in particular, is preferably about 150 nm. The bank portion 112 is stacked with an inorganic bank layer 112a provided in the side of the substrate 2 and an organic bank layer 112b provided to be separate from the substrate 2.

The inorganic bank layer 112a and the organic bank layer 112b are formed to a periphery portion of the pixel electrode 111. The periphery of the pixel electrode 111 and the inorganic bank layer 112a are arranged to overlap each other, in plan view. Also, the organic bank layer 112b is arranged to overlap some of the pixel electrode 111, in plan view. The inorganic bank layer 112a is formed to be more concentrated in center of the pixel electrode 111 than the organic bank layer 112b. Each of the first stacked portions 112e of the inorganic bank layer 112a is formed inside the pixel electrode 111. Accordingly, a lower opening 112c is provided to correspond to a position where the pixel electrode 111 is formed.

An upper opening 112d is formed in the organic bank layer 112b. The upper opening 112d is provided to correspond to a position where the pixel electrode 111 is formed and to correspond to the lower opening 112c. The upper opening 112d is formed to be wider than the lower opening 112c and to be narrower than the pixel electrode 111 as shown in FIG. 4. The upper opening 112d and the electrode 111 may be formed such that the position of the upper portion of the upper opening 112d is almost the same as the position of the end of the pixel electrode 111. In this case, as shown in FIG. 4, the section of the upper opening 112d of the organic bank layer 112b is tilted.

The inorganic bank layer 112a is preferably formed of inorganic materials such as $SiO_2$ or $TiO_2$. The thickness of the inorganic bank layer 112a is preferably between 50 nm and 200 nm and, in particular, is more preferably 150 nm.

The organic bank layer 112b is formed of a heat-resistant and solvent-resistant material such as acryl resin or polyimide resin. The thickness of the organic bank layer 112b is preferably between 0.1 $\mu$m and 3.5 $\mu$m. When the thickness of the organic bank layer 112b is at least 2 $\mu$m, it is possible to let signal wiring lines such as the data lines 102 or the scanning lines 101 for supplying a signal separate from the common electrodes 12 by a sufficient long distance. Accordingly, it is possible to reduce parasitic capacitance generated between the signal wiring lines and the common electrode 12, to thus reduce problems such as delay and bluntness of a signal.

A lyophilic region and a lyophobic region are formed in the bank portion 112. The lyophilic region includes a first stacked portion 112e of the inorganic bank layer 112a and an electrode surface 111a of the pixel electrode 111. The surfaces of them are processed to be lyophilic by a plasma process using oxygen as a processing gas. The region includes the walls of the upper opening 112d and the surfaces 112f of the organic bank layer 112. The surfaces of them are fluorided (treated by the lyophobic property) by a plasma process using 4 fluoro methane as a precursor. The organic bank layer may be formed of a material including fluoro polymer.

The functional layer 110 includes a hole injection/transport layer 110a stacked on the pixel electrode 111 and a light-emitting layer 100b formed of an organic electroluminescent material to be adjacent to the hole injection/transport layer 100a. Another functional layer having a function of an electron injection and transport layer may be formed to be adjacent to the light-emitting layer 110b.

The hole injection/transport layer 110a has functions of injecting holes into the light-emitting layer 110b and of transporting holes to the inside of the hole injection/transport layer 110a. It is possible to improve characteristics of the element such as the light-emitting efficiency or the life time of the light-emitting layer 110b by positioning the hole injection/transport layer 110a between the pixel electrode 111 and the light-emitting layer 110b. The holes injected from the hole injection/transport layer 110a are re-combined with the electrons injected from the common electrode 12 in the light-emitting layer 110b. Accordingly, the light-emitting layer 110b emits light.

The hole injection/transport layer 110a includes a flat portion 110a1 provided in the lower opening 112c and formed on a pixel electrode surface 111a and a periphery portion 110a2 provided in the upper opening 112d and formed on the first stacked portion 112e of the inorganic bank layer. The hole injection/transport layer 110a is formed only on the pixel electrode 111 and depending on a structure, is formed only between the inorganic bank layers 112a (in the lower opening 110c) (The hole injection/transport layer 110a may be in the aforementioned flat portion). The thickness of the flat portion 110a1 is constant, for example between 50 nm and 70 nm.

The periphery portion 110a2 is provided on the first stacked portion 112e to be attached to the wall of the upper opening 112d, that is, the organic bank layer 112b. The thickness of the periphery portion 110a2 is formed thin toward a direction close to the electrode surface 111a and is formed thick toward a direction remote from the electrode surface 111a. The thickness of the periphery portion 110a2 is the thickest near the wall of the lower opening 112d.

The periphery portion 110a2 has the aforementioned shape because the hole injection/transport layer 110a is formed by discharging a first composite including a material for forming the hole injection/transport layer, and a polar solvent into the opening 112, then by removing the polar solvent because the polar solvent is volatilized mainly on the first stacked portion 112e of the inorganic bank layer making the material for forming the hole injection/transport layer concentrated and extracted on the first stacked portion 112e.

The light-emitting layer 110b is formed over the flat portion 110a1 and the periphery portion 110a2 of the hole injection/transport layer 110a. The thickness of the light-emitting layer 110b on the flat portion 112a1 is between 50 nm and 80 nm. The light-emitting layer 110b includes a red light-emitting layer 110b1 to emit red-light, a green light-emitting layer 110b2 to emit green-light and a blue light-emitting layer 110b3 to emit blue-light. The respective light-emitting layers 110b1 to 110b3 are arranged in stripes. The hole injection/transport layer is formed of polythiophene derivatives such as polyethylene dioxythiophene and a compound such as polystyrene sulfonic acid etc. The light-emitting layer 110b is formed by doping perylene-based pigment, cumarine-based pigment, rhodamine-based pigment, for example, rubrene, perylene, 9,10-diphenylanthracene, tetra phenyl butadiene, nile red, cumarine 6, quinacridone etc., to polyfluorene derivatives, polyphenylene derivatives, polyvinyl carbazole, polythiophene derivatives, or polymer materials thereof.

The common electrode 12 formed all over the light-emitting element portion 11 complete a role of flowing current to the functional layers 110, while becoming pairs with the pixel electrodes 111. When the common electrode 12 is cathode, for example, the common electrode 12 may be stacked metal layers such as calcium layers or aluminum layers. In this regard, a cathode near the light-emitting layer may be formed of a metal have a low work function. In particular, the common electrodes 12 directly contact the light-emitting layer 110b, and thus electrons are injected into the light-emitting layer. Also, lithium fluoride may be formed between the light-emitting layer 110 and the common electrodes 12 as a material of the light-emitting layer in order to effectively emit light.

The red and green light-emitting layers 110b1 and 110b2 may be formed of other materials other than lithium fluoride. Therefore, in this regard, a lithium fluoride layer may be formed only on the blue B light-emitting layer 110b3. Layers other than the lithium fluoride layers may be stacked on the red and green light-emitting layers 110b1 and 110b2. Only calcium layer may be formed on the red and green light-emitting layers 100b1 and 110b2 without forming the lithium fluoride layer. The thickness of the lithium fluoride is preferably between 2 and 5 nm and, in particular, about 2 nm. The thickness of the calcium layer is preferably between 2 and 50 nm and, in particular, about 20 nm.

FIG. 5 is an extended view of the power source lines 103R, 103G and 103B above the effective area 2a and the connection wiring lines 99R, 99G and 99B connected to the power source lines, respectively. The connection wiring lines 99R, 99G and 99B are formed of conductive films formed in the first and second wiring line layers 135 and 136. In the present embodiment, the connection wiring lines 99R connected to the power source line 103R closest to the effective area 2a is formed of the conductive film provided in the first wiring line layer 135. The connection wiring line 99B connected to the power source lines 103B remotest from the effective area 2a is formed of the conductive film provided in the second wiring line layer 136. The connection wiring lines 99G connected to the power source lines 103G inserted between the power source lines 103R and 103B is connected to the power source lines 103G in a contact 100G penetrating a first interlayer insulating film 114a. In the contact 100G, conduction is secured between the conductive film provided in the first wiring line layer 135 and the conductive film provided in the second wiring line layer 136.

In the present exemplary embodiment, because the connection wiring lines 99R, 99G and 99B are formed of the first and second wiring line layers 135 and 136, contact portions such as 100G is not provided if possible. Accordingly, it is possible to reduce inconvenience, such as disconnection, by reducing the contact portion.

The connection wiring lines 99R, 99G and 99B are extended to be almost parallel with each other toward the effective area 2a. The widths of the connection wiring lines 99R, 99G and 99B are different from each other at least in some parts. Such difference is due to securing of enough line widths of the connection wiring lines 99R, 99G and 99B and the power source lines 103R, 103G and 103B and the reduction of the widths of the respective connection wiring lines 99R, 99G and 99B to be suitable for the pitch of the pixel of the effective area 2a in order to stably supply a power source voltage.

As shown in FIG. 3, it is preferable that the connection wiring lines 99R, 99G and 99B be basically formed of conductive films in the same wiring layer in the effective area 2a. In the present embodiment, the connection wiring lines 99R, 99G and 99B are formed of the conductive film provided in the second wiring line layer 136. Because the connection wiring lines 99R is formed of the first wiring line layer 135 around the contact portion of the power source lines 103R as shown in FIG. 5, it is necessary that the connection wiring 99R connect the conductive film provided in the first wiring line layer 135 to the conductive film provided in the second wiring line layer 136 in a region where reach to the effective area 2a from the contact portion.

A method of manufacturing the display device according to the present embodiment will be described with reference to the drawings.

A method of forming the active element layer 14 on the substrate 2 is described with reference to FIGS. 6(a) to 8(c). Each of the cross sectional views of FIGS. 6(a) to 8(c) corresponds to cross section taken along plane A-A' in FIG. 2. Further, as explained hereinafter, a impurity concentration is indicated as impurity after annealing.

Further, a base protective layer 2c made of a oxide silicon film is formed on a substrate 2, as shown in FIG. 6(a). Next, an amorphous silicon layer is formed using the ICVD method, plasma method and the like, and then is made into a polysilicon layer 501 by growing crystal grains by a laser annealing method or quick heating method.

Next, as shown in FIG. 6(*b*), the polysilicon layer 501 is patterned by a photolithographic method to form silicon layers 241, 251 and 261 of an island shape and, further, form a gate insulating layer 142 made of a silicon oxide film.

The silicon layer 241 is formed on a position corresponding to an effective area 2*a* to constitute a thin film transistor 123 (hereinafter 'TFT for pixels') to be connected to a pixel electrode 111. Each of the silicon layers 251 and 261 constitute a P-channel type and N-channel type thin film transistor (hereinafter 'TFT for driving circuits') within a scanning line driving circuit 105.

The formation of the gate insulating layer 142 is carried out by forming a silicon oxide film having a thickness of about 30 to 200 nm that covers the silicon layers 241, 251 and 261 and a base protective layer 2*c* by a plasma CVD method, a thermal oxidation method and the like. Here, when the gate insulating layer 142 is formed using the thermal oxidation method, the crystallization of the silicon layers 241, 251 and 261 is also carried out to make these silicon layers into a polysilicon layer. In case of performing a channel doping, for example, boron ions with a dose of about $1\times10^{12}$ cm$^{-2}$ are implanted at the same timing a channel is doped. As a result, the silicon layers 241, 251 and 261 become a low concentration P-type silicon layer having an impurity concentration of about $1\times10^{17}$ cm$^{-3}$.

Next, as shown in FIG. 6(*c*), an ion injection selective mask M1 is formed on some parts of the silicon layers 241 and 261. In this state, phosphor ions are implanted with a dose of about $1\times10^{15}$ cm$^{-2}$. As the result, high concentration impurities are self-aligned and introduced with respect to the ion injection selective mask M1, and high concentration source regions 241S and 261S and high concentration drain regions 241D and 261D are formed in the silicon layers 241 and 261.

Next, as shown in FIG. 6(*d*), after removing the ion injection selective mask M1, a metal film with about 500 nm thickness, such as a doped silicon, a silicide film, an aluminum film, a chrome film or a tantalum film as a first wiring line layer 135 on the gate insulating layer 142. Moreover, by patterning this metal film, a gate electrode 252 of the TFT for P-channel type driving circuit, a gate electrode 242 of the TFT for pixels and a gate electrode 262 of the TFT for N-channel type driving circuit are formed. In addition, by the above patterning, a signal wire 105*a* for a scanning line driving circuit, power source lines 103R, 103G and 103B, a connection wiring line 99R, and parts of a common electrode wiring line 12*a* are simultaneously formed.

Further, phosphor ions are implanted with a dose of about $4\times10^{13}$ cm$^{-2}$ with respect to the silicon layers 241, 251 and 261 using the gate electrodes 242, 252 and 262 as a mask. As the result, low concentration impurities are self-aligned and introduced with respect to the gate electrodes 242, 252 and 262, and, as shown in FIG. 6(*d*), low concentration source regions 241*b* and 261*b* and low concentration drain regions 241*c* and 261*c* are formed in the silicon layers 241 and 261. In addition, low concentration impurity regions 251S and 251D are formed in the silicon layer 251.

Next, as shown in FIG. 7(*a*), an ion injection selective mask M2 is formed on the whole surface excluding the perimeter of the gate electrode 252. Using this ion injection selective mask M2, boron ions are implanted with a dose of about $1.5\times10^{15}$ cm$^{-2}$ with respect to the silicon layer 251. Consequently, the gate electrode 252 also functions as a mask and high concentration impurities are self-aligned and doped in the silicon layer 252. By this, the low concentration impurity regions 251S and 251D are counter-doped to become source and drain regions of the TFT for the P-channel type driving circuit.

Next, as shown in FIG. 7(*b*), after removing the ion injection selective mask M2, a first interlayer insulating film 144*a* is formed on the whole surface of the substrate 2 and, in addition, the first interlayer insulating film 144*a* is patterned by the photolithographic method, thereby mounting a hole H1 for contact hole formation at a position corresponding to the source and drain electrodes of each of TFT and the common electrode wiring line 12*a*.

Next, as shown in FIG. 7(*c*), a conductive layer 504 with about 200 to 800 nm thickness made of metals such as aluminum, chrome, tantalum, etc., is formed as if it to cover the first interlayer insulating film 144*a*, whereby forming a contact hole by burying these metals in the previously formed hole H1. Further, a patterning mask M3 is formed on the conductive layer 504.

Next, as shown in FIG. 8(*a*), the conductive layer 504 is patterned by the patterning mask M3, and the source electrodes 243, 253 and 263 and drain electrodes 244 and 254 of each of TFT, the power source line 103B, the connecting wiring lines 99G and 99B, the scanning line circuit power source wiring line 105*b* and the common electrode wiring line 12*a* are formed as a second wiring line layer 136.

Next, as shown in FIG. 8(*b*), a second interlayer insulating film 144*b* covering the first interlayer insulating film 144*a* is formed of a resin material, for example, such as acryl-based resin. This second interlayer insulating film 144*b* is preferably formed with a thickness of about 1 to 2 μm.

Next, as shown in FIG. 8(*c*), in the second interlayer insulating film 144*b*, the portion corresponding to the drain electrode 244 of the TFT for pixels is removed by etching to form a hole H2 for contact hole formation. At this time, the second interlayer insulating film 144*b* on the common electrode wiring line 12*a* is simultaneously removed. According to the above structure, an active element layer 14 is formed.

Next, referring to FIG. 9(*a*), the sequence of obtaining a display device 1 by forming a light-emitting element portion 11 on the active element layer 14 will be explained below. The cross-section as shown in FIG. 9 corresponds to the cross section taken along plane AA' of FIG. 2.

Firstly, as shown in FIG. 9(*a*), a thin film made of a transparent electrode material such as ITO is formed as if to cover the whole surface of the substrate 2. By patterning the corresponding thin film, the hole H2 mounted on the second interlayer insulating film 144*b* is buried to form a contact hole 111*a* and, in addition, form a pixel electrode 111 and a dummy pixel electrode 111'. The pixel electrode 111 is formed only on the part where the thin film transistor 123 is formed, and is connected to the current thin film transistor (switching element) 123 via the contact hole 111*a*. Further, the dummy electrode 111' is arranged in an island shape.

Next, as shown in FIG. 9(*b*), an inorganic bank layer 112*a* and a dummy inorganic bank layer 212*a* are formed on the second interlayer insulating film 144*b*, the pixel electrode 111 and the dummy pixel electrode 111'. The inorganic bank layer 112 is formed in such a manner that parts of the pixel electrode 111 are opened, and the dummy inorganic bank layer 212*a* is formed as if to fully cover the dummy pixel electrode 111'. The inorganic bank layer 112*a* and the dummy inorganic bank layer 212*a* are formed by forming an inorganic film, such as $SiO_2$, $TiO_2$, SiN and the like, on the whole surface of the second interlayer insulating film 144*b* and pixel electrode 111, for example, by the CVD method, TEOS method, spattering method, deposition method and the like and then patterning the corresponding inorganic film.

Furthermore, as shown in FIG. 9(b), an organic bank layer 112b and a dummy organic bank layer 212b are formed on the inorganic bank layer 112a and the dummy inorganic bank layer 212a. The organic bank layer 112b is formed in such a manner that parts of the inorganic pixel electrode 111 are opened through the inorganic bank layer 112a, and the dummy organic bank layer 212b is formed in such a manner that parts of the dummy inorganic bank layer 212a are opened. In this way, a bank 112 is formed on the second interlayer insulating film 144b.

Continuously, a lyophilic region and a lyohpobic region are formed on the surface of the bank 112. In this embodiment, each region is formed by a plasma treatment process. Specifically, this plasma treatment process at least comprises the step of making the pixel electrode 111, inorganic bank layer 112a and dummy inorganic bank layer 212a to be lyophilic, and making the organic bank layer 112b and dummy organic bank layer 212b to be lyophobic.

That is, the bank 112 is heated at a predetermined temperature, for example, 70 to 80° C., and then, as the step of making lyophilic, a plasma treatment ($O_2$ plasma treatment) is performed at the air atmosphere using oxygen as a reactive gas. Continually, as the step of making liquid repellent, a plasma treatment (CF4 plasma treatment) is performed at the air atmosphere using tetrafluoro-methane as a reactive gas. For the plasma treatment, the heated bank 112 is cooled up to a room temperature, thereby giving lyophilicity and lyophobicity to predetermined portions.

Moreover, a functional layer 110 and a dummy functional layer 210 are formed respectively on the pixel electrode 111 and the dummy inorganic bank layer 212a by an ink-jet method. The functional layer 110 and the dummy functional layer 210 are formed by discharging/drying a composition ink containing a material for a hole injection/transport layer, and then discharging/drying a composition ink containing a light emitting layer material. In addition, after the process of forming the functional layer 110 and the dummy functional layer 210, successive processes are preferably performed under an inert gas atmosphere, such as a nitrogen atmosphere and an argon atmosphere, in order to reduce or prevent the oxidation of the hole injection/transport layer and the light emitting layer.

Next, as shown in FIG. 9(c), a common electrode covering the bank 112, functional layer 110 and dummy functional layer 210 are formed. The common electrode 12 can be obtained by forming a first common electrode layer 12b on the bank 112, on the functional layer 110 and on the dummy functional layer 210 and then forming a second common electrode layer 12c covering the first common electrode layer 12b which is connected to the common electrode wiring layer 12a on the substrate 2.

Finally, a sealing resin 603 such as a epoxy resin is coated on the substrate 2, and a sealing substrate 604 is conjugated to the substrate 2 via the sealing resin 603. In this way, a display device 1 as shown in FIGS. 1 to 3 can be obtained.

In this manner, since the power source line 103B on the outermost side of the effective area 2a, does not overlap the connection wiring lines 99R and 99G connecting to other power source lines 103R and 103G in a plane, it can be mounted on both of the first wiring layer 135 and the second wiring line layer 136. Accordingly, in this exemplary embodiment, the power source lines 103B can be formed with a width almost half of a width compared to a case that the power source lines 103B is mounted at either one of the first wiring line layer 135 or the second wiring line layer 136. As the width of the power source lines 103B is reduced, the frame of a panel can be smaller.

In addition, since the connection wiring line 99R connecting to the power source lines 103R on the innermost side of the effective area 2a does not overlap other power source lines 103G and 103B in a plane, it can be formed on the first wiring line layer 135. For this reason, in this embodiment, the width of the connection wiring lines 99G and 99B mounted on the second wiring line layer 136 can be made larger as much as the width of the connection wiring line 99R, and the manufacture of a display device including the manufacture of a mask can be easily performed. Moreover, in this exemplary embodiment, there is only one contact 100G for electrically connecting the power source lines and the connection wiring lines. It is possible to reduce the dependability of contact resistance.

Second Exemplary Embodiment

A second embodiment is described below. The main difference between a display device layout related to the second embodiment as shown in FIG. 10 and a layout of the first embodiment as shown in FIG. 2 is that at least a part of the common electrode wiring line 12a are overlapped with at least a part of at least one of the power source lines 103R, 103G and 103B mounted around the effective area 2a when seen from a plane. The common electrode wiring lines 12a extends from the side on which a flexible substrate 5 is mounted toward the side facing the corresponding side, and each are mounted between the two facing sides among the four sides constituting the outer periphery of the substrate 2 and the effective area 2a.

The common electrode wiring line 12a at one side is arranged to be overlapped with the power source lines 103R and the common electrode wiring line 12a at the other side is arranged to be overlapped with at least a part of the power source lines 103G and 103B.

The corresponding cross-sectional view will be shown in FIG. 11. The common electrode wiring line 12a is constituted by the conductive film mounted on the second wiring line layer 136 and is connected by the common electrode 12.

The power source lines 103R, 103G and 103B are formed by the conducive film mounted on the first wiring layer 135 below the second wiring line layer 136. They are separated from the common electrode wiring lines 12a and the power source lines 103R, 103G and 103B by the first interlayer insulating film 144a and thus are electrically insulated. At the connection between the common electrode layer 12a and the common electrode 12, a conductive layer 12d made of, for example, ITO is interposed.

As explained above, although the common electrode wiring line 12a is formed so as to be overlapped with at least parts of the power source lines 103R, 103G and 103B, this enables an electro-optical device to be stably driven since a capacity is formed between the common electrode wiring lines 12a and the power source lines 103R, 103G and 103B and the fluctuation of power voltage is alleviated.

The power source lines 103R, 103G and 103B are each connected to the connection wiring lines 99R, 99G and 99B via the contacts 100R, 100G and 10B, as shown in FIG. 12, in the region between the effective area 2a and the side facing the side where the flexible substrate is mounted. With respect to the contacts 100R, 100G and 100B, the conductive film with the first wiring line layer 135 are connected to the conductive film with the second wiring line layer. The connection wiring lines 99R, 99G and 99B are constituted using the conductive film mounted on the second wiring line layer 136. The line width of the connection wiring lines 99R, 99G and 99B is smaller than that of the corresponding power source lines 103R, 103G and 103B.

Additionally, as described above, in the effective area 2a, it is preferable that the connection wiring lines 99R, 99G and 99B be basically formed using the conductive film on the same wiring line layer. In this embodiment, the connection wiring lines are formed using the conductive film mounted on the second wiring line layer 136. Meanwhile, the connection wiring lines 99R, 99G and 99B are formed using the conductive film mounted on the second wiring line layer 136. Thus, unlike FIG. 5, it is unnecessary that the connection wiring lines 99R 99G and 99B are to be connected to the conductive film mounted on the second wiring line layer 136 from the conductive film mounted on the first wiring line layer 135 in the region extending from the contact portion to the effective area 2a.

An example of an electronic apparatus with a display device 1 according to the above exemplary embodiment will be explained.

FIG. 13(a) is a perspective view showing one example of a cellular phone. In FIG. 13(a), reference numeral 1000 represents a main body of the cellular phone and reference numeral 1001 represents a display unit using an organic EL device 1.

FIG. 13(b) is a perspective view showing an example of a wristwatch type electronic apparatus. In FIG. 13(b), reference numeral 1100 represents a main body of the wristwatch and reference numeral 1101 represents a display unit using the organic EL device 1.

FIG. 13(c) is a perspective view showing an example of a portable data processing device such as a word processor and PC. In FIG. 13(c), reference numeral 1200 represents a data processing device, reference numeral 1202 represents an input unit such as a keyboard, reference numeral 1204 represents a main body of the data processing device and reference numeral 1206 represents a display unit using the organic EL device 1.

While the above embodiment has been described herein, it is understood that many modifications and variations may be devised given the above disclosed principles of the invention. It is intended that all such modifications and variations be considered as included within the spirit and scope of this invention.

For example, although the power source line 103B is constructed with a double-layered structure in this embodiment, the power source line arranged on the outermost side with respect to the effective area 2a may be replaced by other power source lines. In addition, the power source lines and connecting wiring lines mounted on the first wiring layer 135 and second wiring layer 136 may be arranged conversely.

In addition, in this embodiment, although the light-emitting element portion 11 is constructed above the substrate 12 in the order of the pixel electrode 111, the hole injection/transport layer 110a, the light emitting layer 110b and the common electrode 12, but not limited thereto. It may be also constructed in a reversed manner. Moreover, in this embodiment, although an example has been explained where the light of the light-emitting element portion 11 is emitted to the outer side face via the transparent substrate 2, the light of the light-emitting element portion 11 can be emitted via a sealing portion 3 on the opposite side of the transparent substrate 2. In this case, as described above, it is preferred that a common electrode and sealing layer with excellent light transmittance (transparency) are mounted.

Moreover, although this embodiment has been described in view of a case where each of light emitting layers of RGB are arranged in a stripe fashion, the present invention is not limited thereto and various arrangement structures can be employed including a stripe arrangement, a mosaic arrangement and a delta arrangement.

As described above, in the present invention, an electro-optical device and electronic apparatus of high quality which realize the narrowing of a frame region can be obtained since they are small-sized while being easy to manufacture.

This exemplary embodiment represents one mode of the present invention, but is not limited thereto. It is apparent that all such modifications and variations be considered as included within the spirit and scope of this invention.

What is claimed is:

1. An electro-optical device, comprising:
   a substrate having a first layer;
   a plurality of light-emitting power source wiring lines arranged in the first layer of the substrate;
   electrodes;
   a second layer; and
   a plurality of connection wiring lines to connect the light-emitting power source wiring lines to the corresponding electrodes arranged in the second layer electrically insulated from the first layer;
   an outermost light-emitting power source wiring line among the plurality of light-emitting power source wiring lines being provided in both the first and second layers.

2. The electro-optical device according to claim 1, the connection wiring lines connected to the innermost light-emitting power source wiring line among the plurality of light-emitting power source wiring lines being provided in the first layer.

3. An electro-optical device, comprising:
   a substrate;
   a first electrode region where first electrodes are arranged in a matrix on the substrate;
   a second electrode;
   light-emitting power source wiring lines;
   second electrode wiring lines disposed around a first electrode region, the light-emitting power source wiring lines being connected to the first electrodes, the second electrode wiring lines being connected to the second electrode; and
   a functional layer being interposed between the first electrodes and the second electrode;
   the light-emitting power source wiring lines and the second electrode wiring lines being arranged such that at least some of the light-emitting power source wiring lines and the second electrode wiring lines overlap each other in plan view.

4. The electro-optical device according to claim 3, interlayer insulating films being arranged between the light-emitting power source wiring lines and the second electrode wiring lines.

5. An electro-optical device, comprising:
   a plurality of pixels, which are provided in an effective area on a substrate, each having an electro-optical element including a functional layer interposed between a first electrode and a second electrode;
   electrode wiring lines connected to the second electrodes outside the effective area;
   connection wiring lines connected to the first electrodes through an active element and provided at least in the effective area; and power source lines connected to the connection wiring lines outside the effective area;

at least some of the power source lines being formed of a plurality of conductive films separated by interlayer insulating films and conductive materials electrically connecting the plurality of conductive films to each other.

6. An electro-optical device, comprising:

a plurality of pixels, which are provided in an effective area on a substrate, having an electro-optical element including a functional layer interposed between a first electrode and a second electrode;

electrode wiring lines connected to the second electrodes outside the effective area;

connection wiring lines connected to the first electrodes through active elements and provided at least in the effective area; and power source lines connected to the connection wiring lines outside the effective area;

the plurality of power source lines being provided outside the effective area, and among the power source lines, at least some of the power source lines provided to be remotest from the effective area being formed of a plurality of conductive films separated by interlayer insulating films and conductive materials electrically connecting the plurality of conductive films to each other.

7. An electro-optical device, comprising:

a plurality of pixels, which are provided in an effective area on a substrate, having an electro-optical element including a functional layer interposed between a first electrode and a second electrode;

electrode wiring lines connected to the second electrodes outside the effective area;

connection wiring lines connected to the first electrodes through active elements and provided at least in the effective area; and power source lines connected to the connection wiring lines outside the effective area;

the plurality of power source lines being provided outside the effective area;

among the power source lines, the power source line provided to be the closest to the effective area being formed of a conductive film provided only in one wiring line layer.

8. An electro-optical device, comprising:

a plurality of pixels, which are provided in an effective area on a substrate, having an electro-optical element including a functional layer interposed between a first electrode and a second electrode;

electrode wiring lines connected to the second electrodes outside the effective area;

connection wiring lines connected to the first electrodes through active elements and provided at least in the effective area; and power source lines connected to the connection wiring lines outside the effective area;

the width of the connection wiring lines being different from the width of the power source lines, to which corresponding connection wiring lines are connected.

9. An electro-optical device, comprising:

a plurality of pixels, which are provided in an effective area on a substrate, each having an electro-optical element including a functional layer interposed between a first electrode and a second electrode;

electrode wiring lines connected to the second electrodes outside the effective area;

connection wiring lines connected to the first electrodes through active elements and provided at least in the effective area; and power source lines connected to the connection wiring lines outside the effective area;

the width of a first portion of the connection wiring lines being different from the width of a second portion of the connection wiring lines.

10. An electro-optical device, comprising:

a plurality of pixels, which are provided in an effective area on a substrate, each having an electro-optical element including a functional layer interposed between a first electrode and a second electrode;

electrode wiring lines connected to the second electrodes outside the effective area;

connection wiring lines connected to the first electrodes through active elements and provided at least in the effective area; and power source lines connected to the connection wiring lines outside the effective area;

at least one of the plurality of connection wiring lines being formed of a plurality of conductive films, each of which being provided in each of the plurality of wiring line layers, and conductive materials connecting the conductive films to each other.

11. An electro-optical device, comprising:

a plurality of pixels, which are provided in an effective area on a substrate, each having an electro-optical element including a functional layer interposed between a first electrode and a second electrode;

electrode wiring lines connected to the second electrodes outside the effective area;

connection wiring lines connected to the first electrodes through active elements and provided at least in the effective area; and power source lines connected to the connection wiring lines outside the effective area;

second conductive films forming at least a part of the power source lines being formed between first conductive films forming at least a part of the electrode wiring lines and the substrate;

the first conductive film and the second conductive film being separated by a interlayer insulating film; and at least a part of the first conductive film overlapping at least a part of the second conductive film.

12. The electro-optical device according to claim 11, the second conductive films being connected to the connection wiring lines through contact portions provided in the interlayer insulating films.

13. The electro-optical device according to claim 5, the functional layer being formed of an organic electroluminescent material.

14. An electronic apparatus, comprising:

the electro-optical device according to claim 1.

* * * * *